(12) United States Patent
Perlo et al.

(10) Patent No.: US 7,884,277 B2
(45) Date of Patent: Feb. 8, 2011

(54) APPARATUS FOR THE CONVERSION OF ELECTROMAGNETIC RADIATION IN ELECTRIC ENERGY AND CORRESPONDING PROCESS

(75) Inventors: Piero Perlo, Sommariva Bosco (IT); Mauro Brignone, Orbassano (IT)

(73) Assignee: C.R.F. Società Consortile per Azioni, Orbassano (Turino) (IT)

( * ) Notice: Subject to any disclaimer, the term of this patent is extended or adjusted under 35 U.S.C. 154(b) by 749 days.

(21) Appl. No.: 11/878,315

(22) Filed: Jul. 23, 2007

(65) Prior Publication Data
US 2008/0017236 A1    Jan. 24, 2008

(30) Foreign Application Priority Data
Jul. 24, 2006    (EP)    .................................. 06425522

(51) Int. Cl.
H01L 35/34    (2006.01)
H01L 35/00    (2006.01)
H01L 37/00    (2006.01)
H01L 35/30    (2006.01)

(52) U.S. Cl. .................... 136/206; 136/201; 136/205

(58) Field of Classification Search .............. 136/201, 136/205, 206
See application file for complete search history.

(56) References Cited

U.S. PATENT DOCUMENTS

| 4,251,291 | A | * | 2/1981 | Gomez ...................... 136/206 |
| 4,257,823 | A |   | 3/1981 | Bevilacqua et al. |
| 4,710,588 | A |   | 12/1987 | Ellion |
| 6,310,383 | B1 | * | 10/2001 | Watanabe et al. ........... 257/470 |

(Continued)

FOREIGN PATENT DOCUMENTS

DE    199 19 023    12/2000

(Continued)

OTHER PUBLICATIONS

European Search Report dated Mar. 13, 2007.

*Primary Examiner*—Jeffrey T Barton
*Assistant Examiner*—Allison Bourke
(74) *Attorney, Agent, or Firm*—Nixon & Vanderhye P.C.

(57) ABSTRACT

An apparatus is described that converts electromagnetic radiation into electric current, of the type comprising a plurality of junctions between a first element (11; 111) of material with conduction through carriers of positive charge and a second element (12; 112) of a material with conduction through carriers of negative charge, said plurality of junctions defining a plurality of couples (10; 111, 112) comprising a hot junction (19) and a cold junction (18), said plurality of couples (10; 110) receiving a thermal flow (FT) generated by a radiation (R) incident in the direction of a region (172) including the hot junction (19), said apparatus (20; 30; 70; 170; 190) including a device (25; 75; 175) to guide said radiation (R) towards said plurality of couples (10; 111, 112). According to the invention, said first element (11; 111) of material with conduction through carriers of positive charge and/or said second element (12; 112) of material with conduction through carriers of negative charge comprise nanostructured materials and in that said device to guide said radiation (R) comprises a plurality of guiding elements (25; 75) that guide said radiation (R) onto faces (19; 39; 119) exposed to said radiation (R) of the respective first element (11) and second element (12) of the couples (10).

38 Claims, 9 Drawing Sheets

U.S. PATENT DOCUMENTS

| | | | |
|---|---|---|---|
| 6,313,391 B1 * | 11/2001 | Abbott | 136/200 |
| 2003/0111104 A1 | 6/2003 | Akamatsu | |
| 2006/0102224 A1 | 5/2006 | Chen et al. | |

FOREIGN PATENT DOCUMENTS

| | | |
|---|---|---|
| DE | 103 39 952 | 4/2005 |
| EP | 0 766 102 | 4/1997 |
| GB | 2 277 198 | 10/1994 |
| JP | 2003322419 | 11/2003 |
| WO | WO 8001438 | 7/1980 |
| WO | WO 92/13362 | 8/1992 |

* cited by examiner

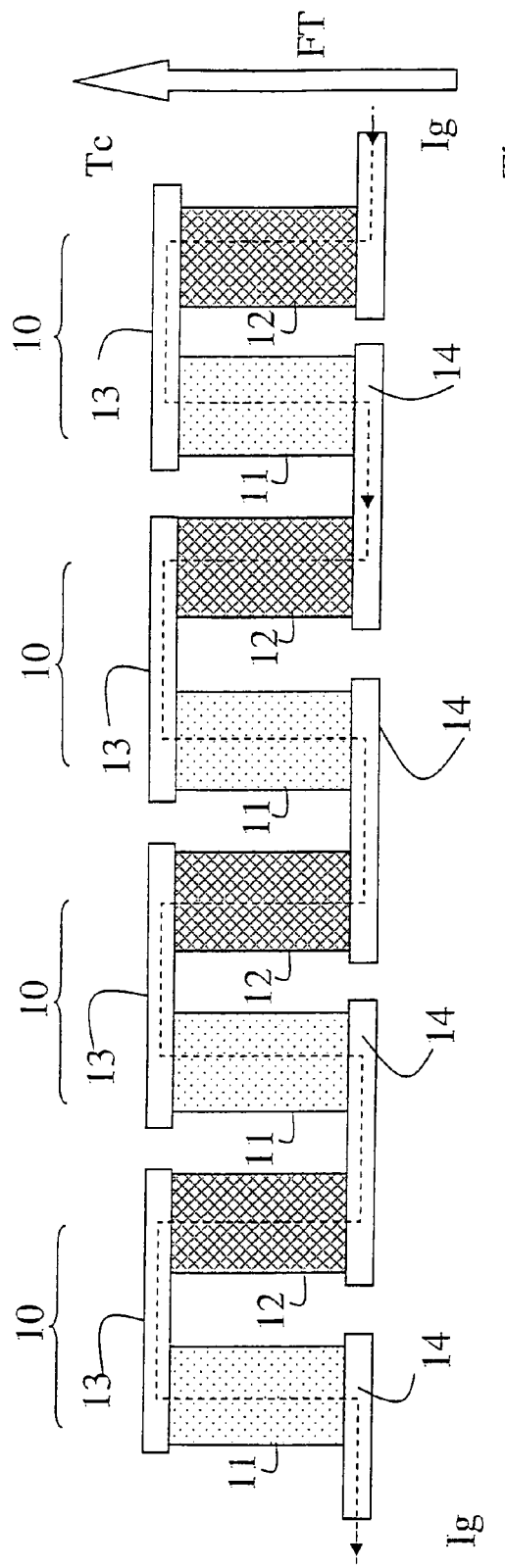
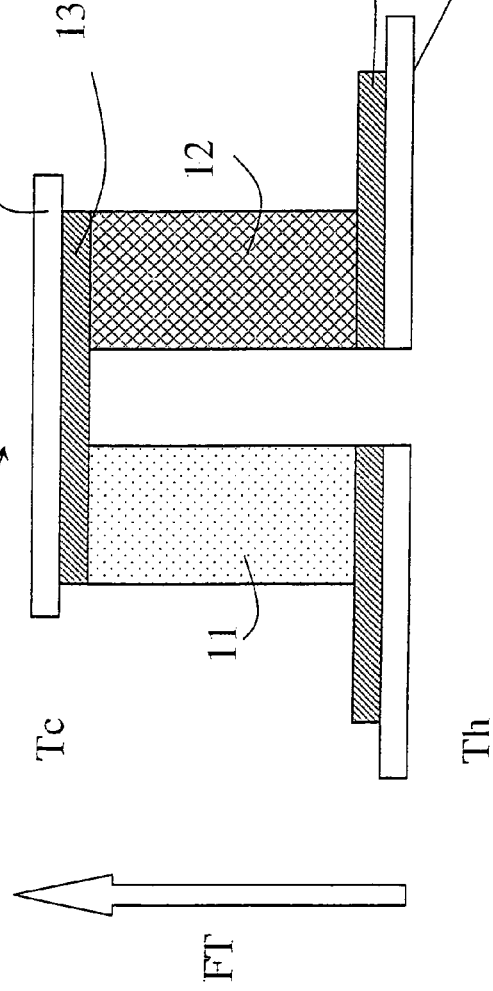
Fig. 1
Prior Art
Fig. 2
Prior Art

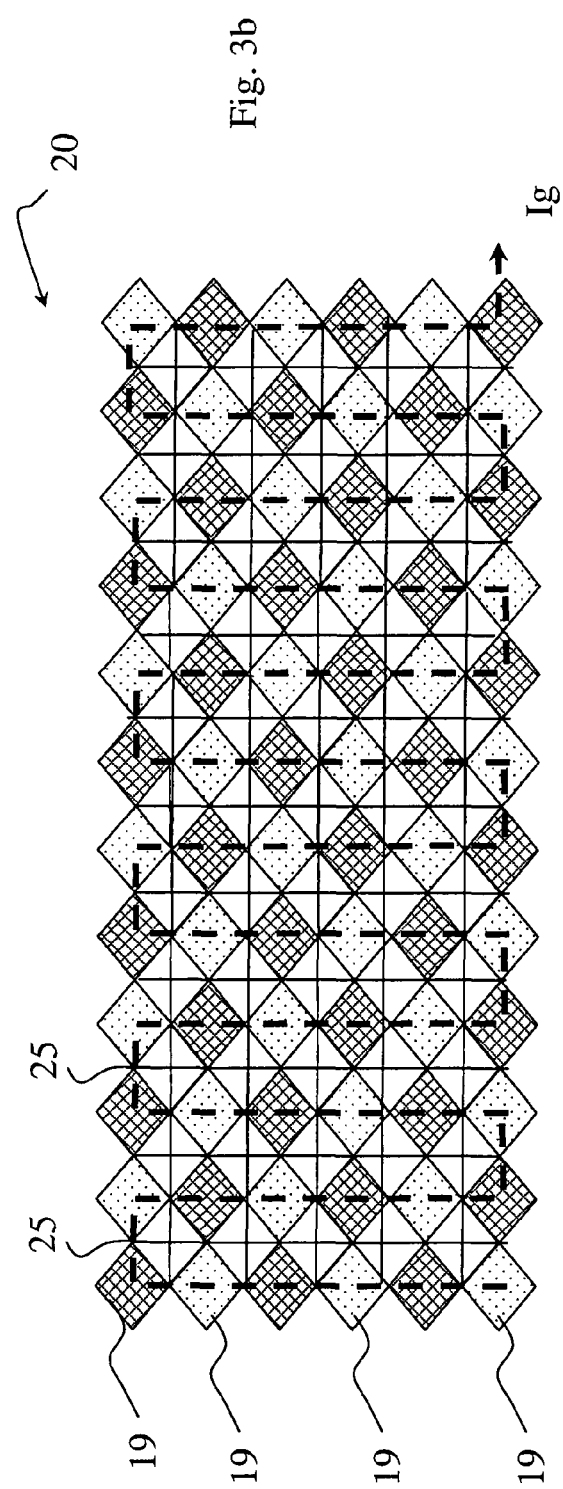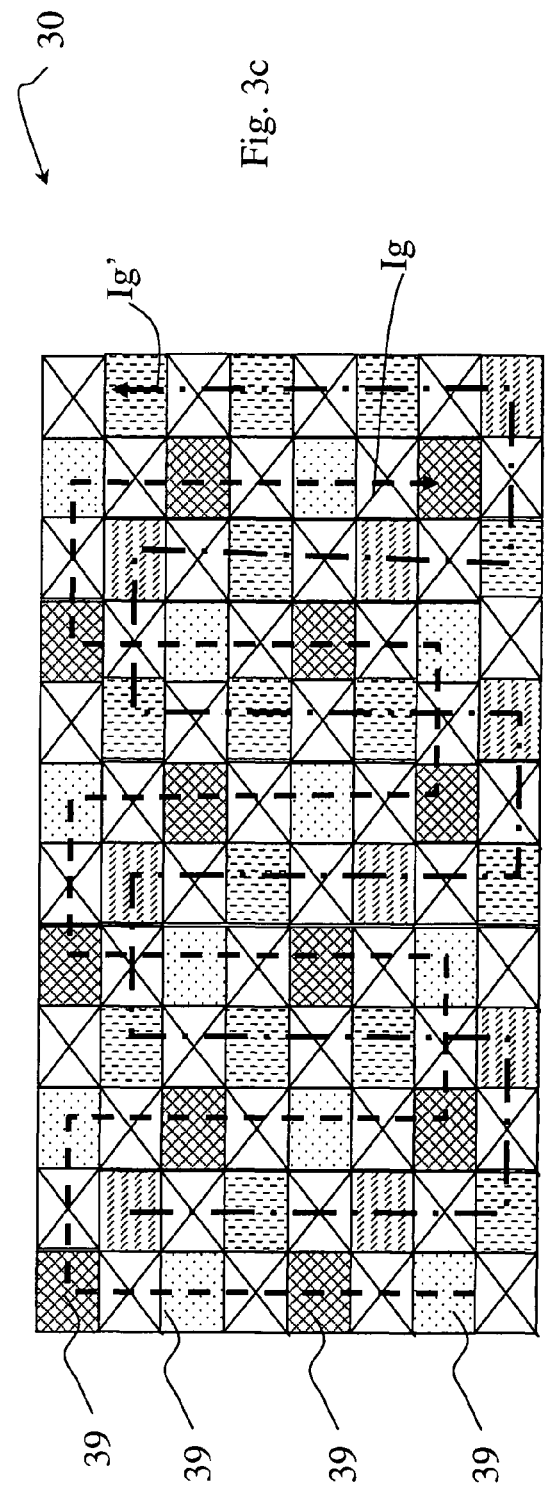

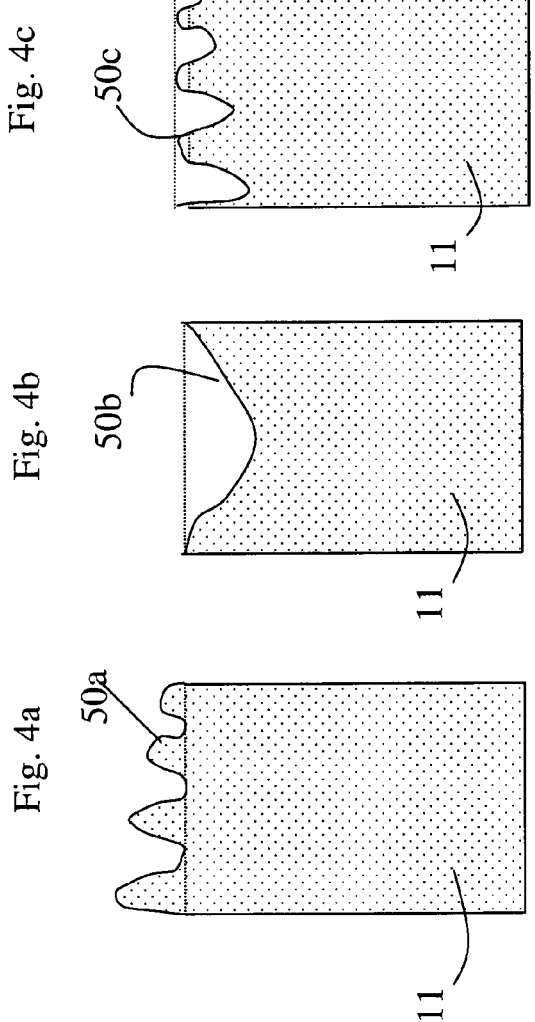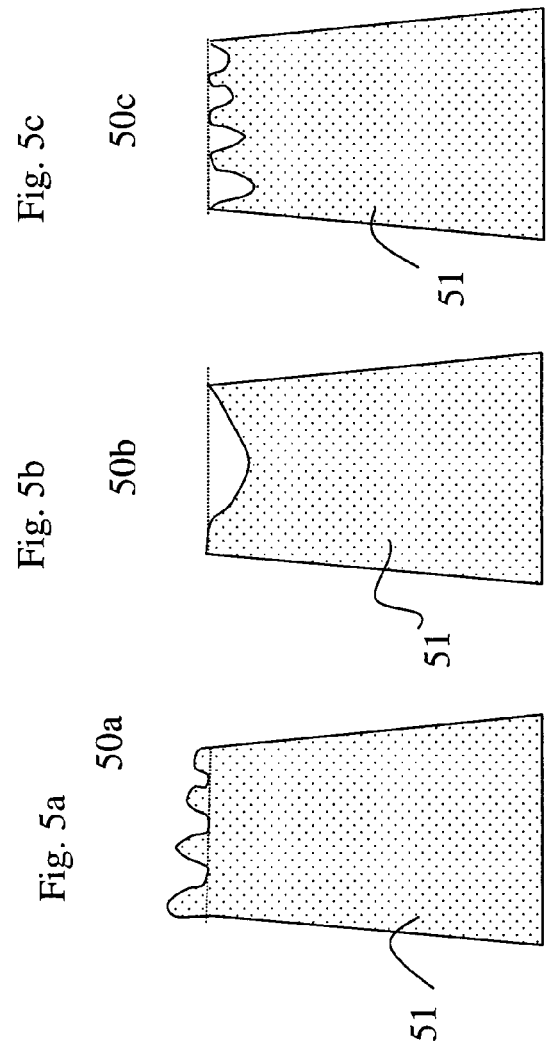

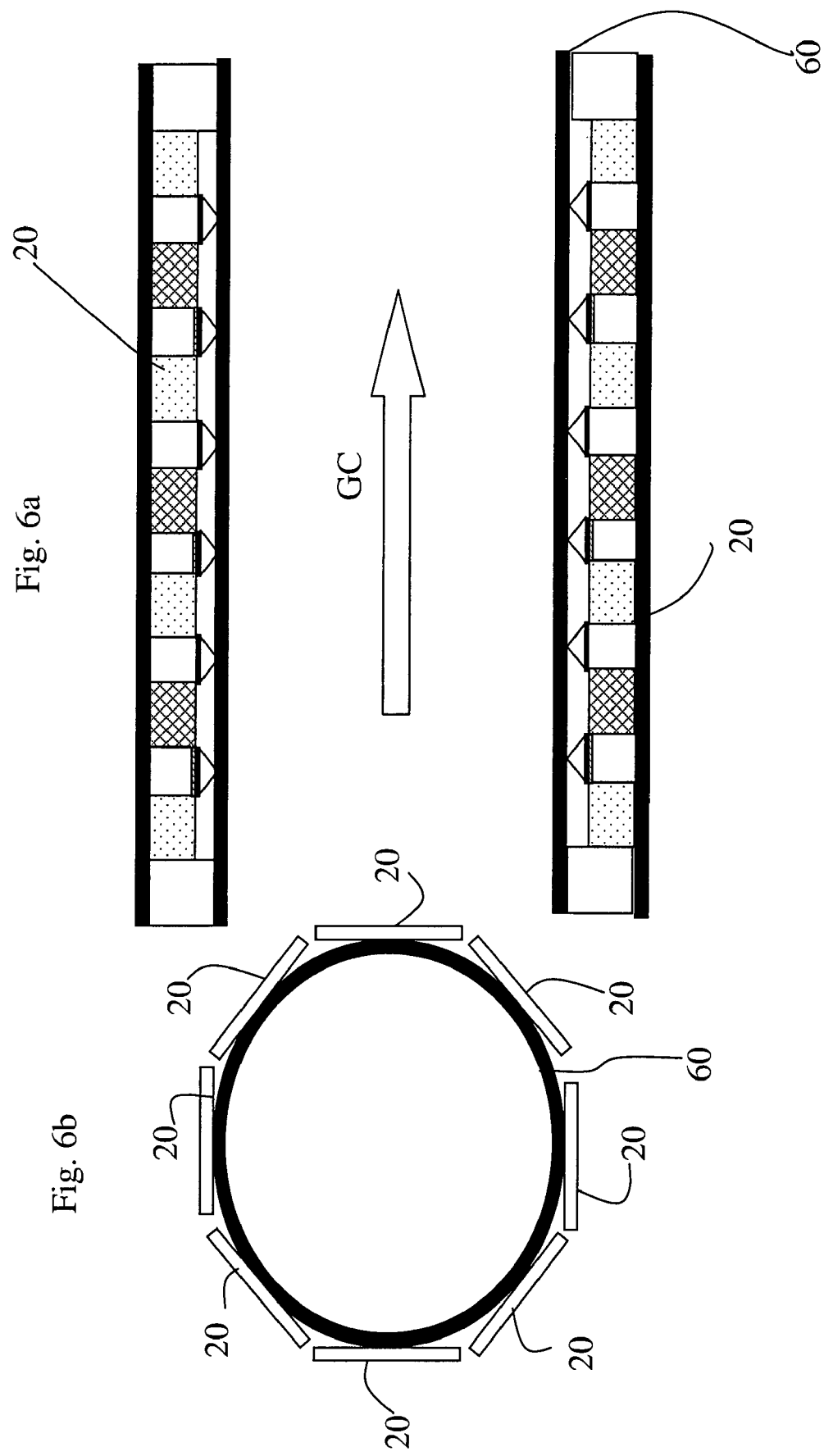

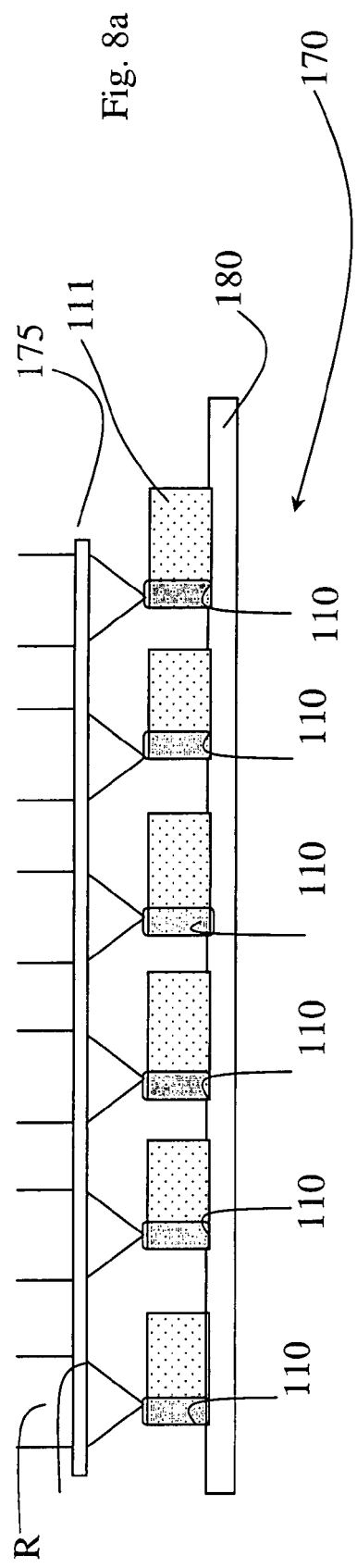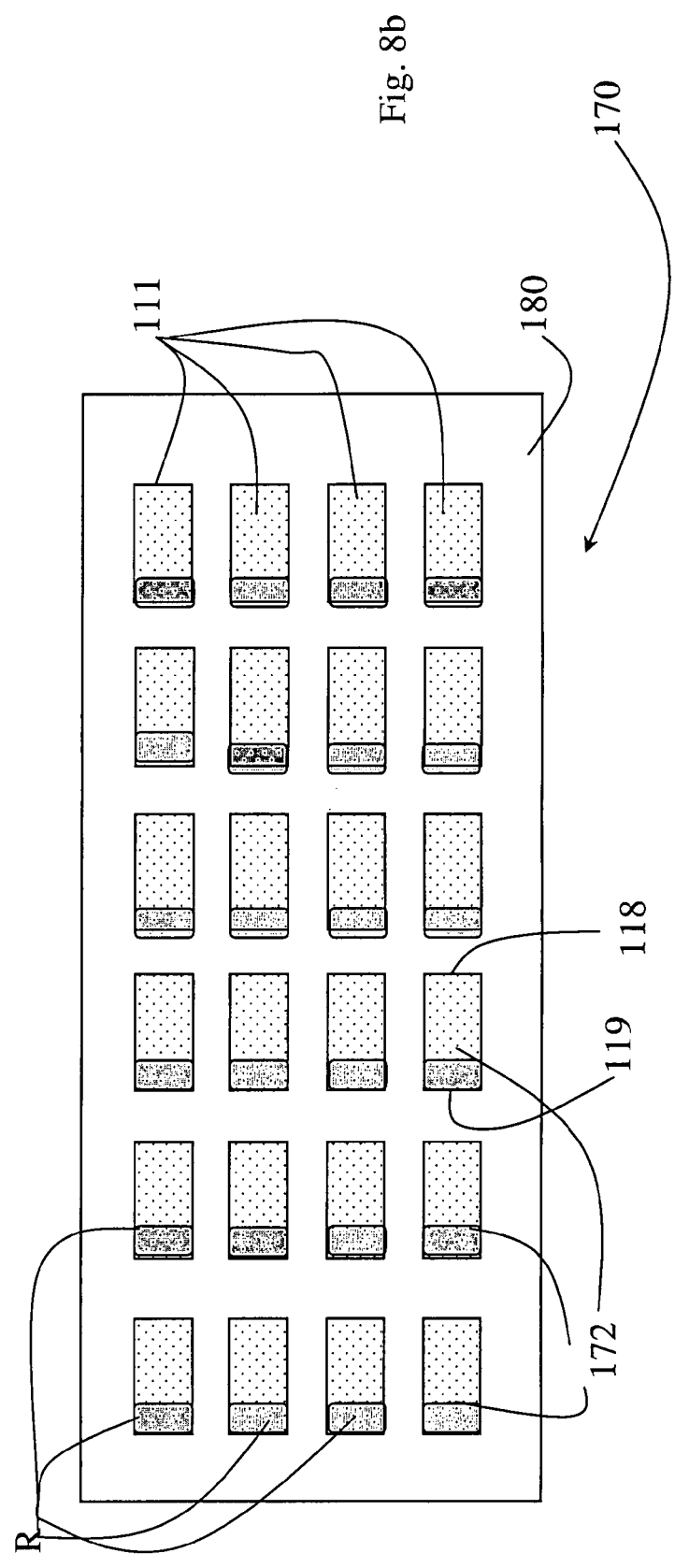

APPARATUS FOR THE CONVERSION OF ELECTROMAGNETIC RADIATION IN ELECTRIC ENERGY AND CORRESPONDING PROCESS

The present invention concerns an apparatus to convert electromagnetic radiation into electric energy comprising a plurality of junctions between a first element in a material with conduction to positive charge carriers and a second element in a material with conduction to negative charge carriers.

In the field of generating energy through thermoelectric generating apparatuses it is known that the Seebeck effect can be exploited, taking advantage of the property of a pair of dissimilar conductors, respectively with conduction through carriers of positive charge and with conduction through carriers of negative charge, connected at their ends through two metallic junctions, to produce a voltage when a difference in temperature is applied to the junctions.

The Seebeck effect is widely exploited for the production of temperature sensors known as thermocouples, but may also be employed for the thermoelectric generation of energy, in particular employing couples of semiconductors with p type conduction and with n type conduction.

FIG. 1 shows, in diagram form, an example of a thermoelectric couple 10 of this type that comprises an element of n type semiconductor material 11 and an element of p type semiconductor material 12, both substantially of columnar and parallelopiped shape, that are connected at one of their ends through a cold junction of metal 13, which is covered with a ceramic layer 15 that dissipates heat. At the other end the elements of semiconductor material 11 and 12 are likewise connected to hot junctions of metal 14, covered with respective layers of ceramic 16. As is more clearly shown in FIG. 2, a plurality of thermoelectric couples 10 is connected according to an arrangement in series, with respect to a generated electric current Ig, whereas, with respect to a thermal flow FT determined by a cold junction temperature Tc and a hot junction temperature Th, the thermoelectric couples 10 are arranged in parallel.

The terms "cold injunction" and "hot junction" will from now on in all cases be used to indicate respectively the junction that is least exposed to the source of heat, in particular to radiation, and the junction that is most exposed to the source of heat, as is common in the field of thermoelectric devices.

The conversion efficiency of a thermoelectric generating apparatus depends on the temperature Tc of the cold junction and on the temperature Th of the hot junction, and also on the figure of merit ZT determined by the materials used for the couples, which depends in a directly proportional manner on the square of the Seebeck coefficient and on the electric conductance, and in an inversely proportional manner on the sum of the electronic thermal conductance and the phononic thermal conductance.

Recently, the nanostructuring of materials has made it possible to increase the value of the figure of merit ZT from approximately 1 to values above 3, both in materials of the bulk type and in materials that contain super-gratings, quantum dots, nanowires and other types of nanostructures.

The bulk (massive) materials most commonly used for this purpose are Bi2Te3/Sb2Te3, PbTe, TAGS) and Si—Ge. Other bulk nanostructured materials are also known that may be subdivided into the families of the skutterudites, the clatrates, the complex calcogenides, oxides, Heusler alloys, quasicrystals, pentatellurides (Zr1-xHfxTe5, etc.), rare earths, (Ce3Pt3Sb4, etc.), silicides of transition metals, boron carbides, Zn4Sb3, tellurides containing tallium, and Bi—Sb alloys.

Thermoelectric systems that perform the conversion of radiant energy and, in particular, of solar energy to electric energy are known, for example, from the articles in the Journal of Power Sources 115 (2003) 141-148, "Solar thermolectric generator based on skutterudites", H. Scherrer, L. Vikhor, B. Lenoir, A. Dauscher, P. Poinas, or in Applied Thermal Engineering 23 (2003) 1407-1415, "Electrical performance of skuterudites solar, thermoelectric, generators", B. Lenoir A. Dauscher, P. Poinas, H. Scherrer, L. Vikhor.

Apart from improving materials, the efficiency of such conversion apparatuses in any case requires also to be improved.

From the German patent application no. DE10339952 an infrared temperature sensor device is known, bearing semiconductor elements p and n arranged in series. This device comprises a layer of radiation absorption, to generate heat, situated above the hot junction. Above this layer are situated lenses to focus the radiation onto the absorption layer overlying the hot junctions and an insulating layer, which transforms it into heat. This solution however appears complex, requiring the addition of absorption layers that are particularly efficient in the infrared.

The present invention has as its purpose that of providing a solution capable of producing an apparatus for the conversion of electromagnetic radiation to energy comprising a plurality of junctions between a first element of material with conduction through positive charge carriers and a second element of material with conduction through negative charge carriers provided with greater conversion efficiency than known systems.

According to the present invention, an apparatus for the conversion of electromagnetic radiation, of the solar type or having other origin, for example from a thermal radiator, is proposed that operates through the sum of the thermionic, thermoelectric and tunnel effects to achieve the absorption of all or as much as possible of the spectrum of incident electromagnetic radiation, by the materials of p type and of n type. On the hot junction side, where radiation is absorbed, heating of the surface takes place and thus a thermal gradient is generated in the structure that induces thermoelectricity and electronic thermoemission. The radiation incident directly on the nanostructures, in particular on the nanoclusters, in its turn induces the emission of tunnel electrons that flow as a cascade in the nanostructure by effect of the electromotive force induced by the thermal gradient. In particular this is achieved by leaving the faces of the hot junction uncovered to receive the incident radiation directly and by guiding the radiation onto these uncovered faces through appropriate radiation guiding elements.

According to the present invention, almost total absorption of the solar spectrum or in general of the electromagnetic radiation is achieved thanks to an apparatus to convert electromagnetic radiation to electric energy and to a corresponding conversion procedure having the characteristics described specifically in the attached claims.

The invention will now be described with reference to the attached drawings, provided as a simple example without limiting intent, in which:

FIG. 1 represents in diagram form a thermoelectric generation element according to the known art;

FIG. 2 represents in diagram form a thermoelectric generation apparatus according to the known art;

FIG. 3b represents in principle a scheme for a first arrangement of conversion apparatuses according to the invention;

FIG. 3c represents in principle a scheme of a second arrangement of conversion apparatuses according to the invention;

FIGS. 4a, 4b and 4c represent a first variant of elements of the conversion apparatus according to the invention;

FIGS. 5a, 5b and 5c represent a second variant of elements of the conversion apparatus for electromagnetic radiation to electric energy according to the invention;

FIGS. 6a and 6b represent an application of the apparatus to convert electromagnetic radiation to electric energy according to the invention;

FIGS. 8a and 8b represent a further variant of the apparatus to convert electromagnetic radiation to electric energy according to the invention;

Figure 3A:
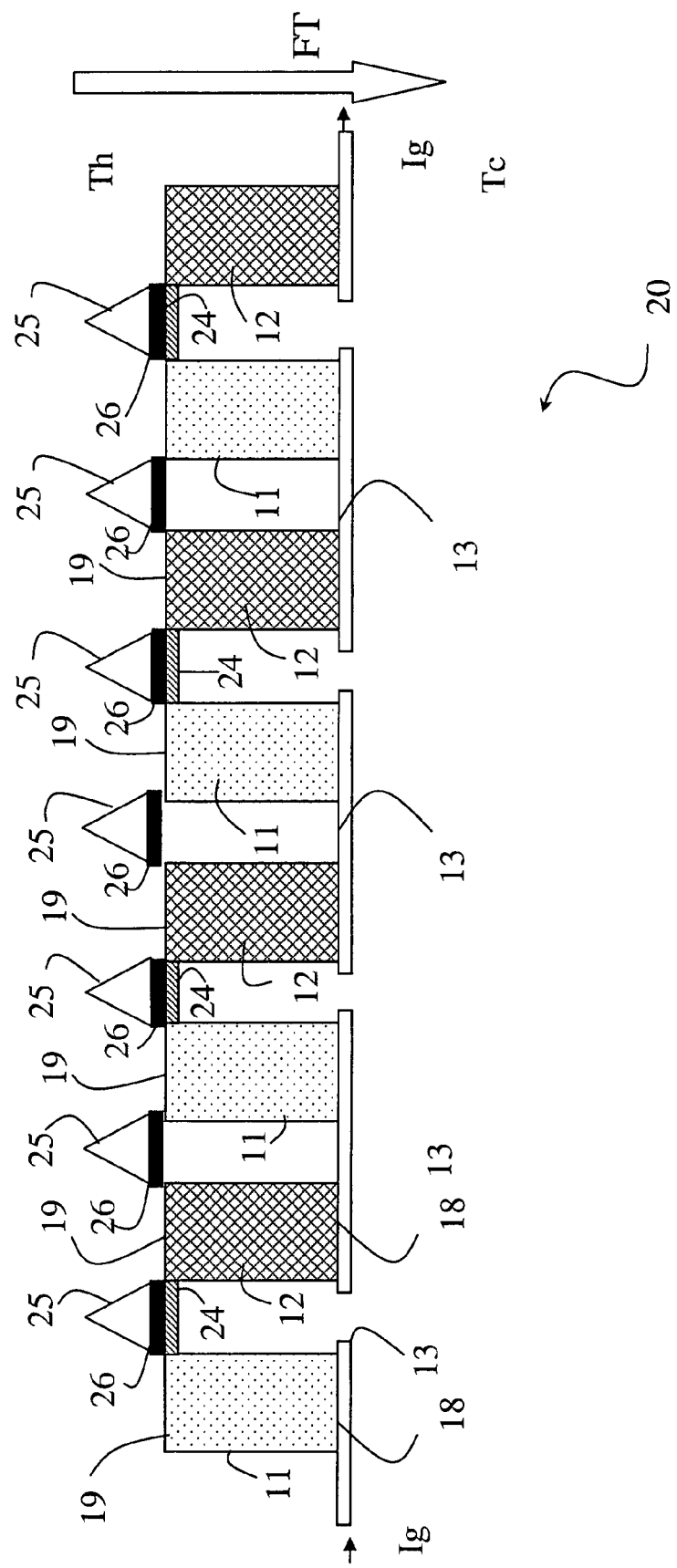
FIG. 3a represents in diagram form an apparatus to convert electromagnetic radiation to electric energy according to the invention.

In brief, the proposed conversion apparatus, in the field of systems of elements of materials of types p and n, arranged alternately in a configuration in series with regard to the generated current and preferably in parallel with regard to the thermal gradient, substantially entails providing for devices, interposed between pairs of elements having p type and n type conduction, which are capable of guiding, on the hot side, directly onto the elements of the thermoelectric couple, the radiation capable of generating heat, thermionic emission and the tunnel effect, thus avoiding the loss of radiation to parts of the system that are not capable of generating energy. According to a further aspect of the invention, the hot-junction metal connection is made leaving the end parts exposed to radiation and associating the devices to guide the radiation directly onto the metal connection.

Modules based on thermionic emission may be considered in many ways as a variant of thermoelectric modules based on nanostructured materials in which, indeed, the nanoscopic dimensions of the materials facilitate thermoelectric emission.

When an element or a compound is heated to a sufficiently high temperature, it begins to emit electrons. In the air it is impossible to note this phenomenon, because the emitted electrons are immediately neutralised by the molecules of the surrounding air. In a vacuum, though, they may be attracted to a positive electrode, and may thus constitute a true electric current. The higher is the temperature, the greater the electronic emission.

A similar phenomenon may also come about in a device that is entirely in the solid state in which the two electrodes, one heated and the other cooled, are separated by a "barrier" material to replace the vacuum. In the heated electrode some electrons achieve a high energy (hot electrons) thanks to which they may cross the energy barrier that separates them from the second electrode. The movement of charges in the opposite direction cannot come about because in the second electrode, maintained at a lower temperature, the electrons have insufficient energy to cross the barrier. Thus the difference in temperature generates a current that may be used to supply an external load.

However, thermionic devices must be distinguished from thermoelectric devices since the transport of the charges is of the ballistic type in the former and of the diffusive type in the latter. The thermodynamic limits of the devices are the same, they reach the same conditions of reversibility and again in some conditions they may be described by the same transport equations, as for example has been described in the publication "A Comparison Between Solid-state Thermionics and Thermoelectrics", T. E. Humphrey and M. F. O'Dwyer, Journal of Applied Physics 98, 026108, 2005, or in the publication "Efficiency in nanostructure thermionic and thermoelectric devices", M. F. O'Dwyer, T. E. Humphrey, R. A. Lewis and C. Zhang, Physical Review B, 72, 205330, 2005.

Inside a composite nanostructured material subjected to a thermal gradient, two different charge transport mechanisms of the ballistic type may be distinguished: thermionic transport and transport due to the tunnel effect.

When two different materials (metal/semiconductor, semiconductor/semiconductor) are brought into contact, the electric charges present in the connection zone become redistributed until an energy equilibrium is reached and in consequence the energy levels close to the interface fold, creating potential barriers that impede a further redistribution of charges (let us assume that the carriers are electrons, although similar considerations also hold in the case of holes). The height $E_0$ and thickness d of the barrier depend on the work of extraction of the metal and of the semiconductors, on the electronegativity of the semiconductors and on their band gap.

Depending on the height and thickness of the barrier the electrons may cross it thanks to the tunnel effect or be thermally excited above this.

In a thermoelectric device subjected to a high hot-junction temperature the predominant transport mechanism will be of the thermionic type characterised by a current density:

$$j \propto T^2 \exp\left(-\frac{eE_0}{k_B T}\right).$$

However, if the thickness of the barrier is sufficiently reduced (2÷3 nm) there will also be a contribution to charge transport linked to the tunnel effect. Tunnelling comes about if:

$$\left[\frac{h^2 E_0}{(8\pi^2 m_e d^2)}\right]^{-1/2} k_B T \ll 1$$

where $m_e$ is the effective mass of the electrons in the thermoelectric material, h is Planck's constant and $k_B$ is Boltzman's constant.

If, in a nanostructured material subjected to a thermal gradient, metallic nanoparticles or semiconductors are present (diameter 1÷5 nm) and if the source of heat is a source of electromagnetic radiation, a further phenomenon connected to charge transport mechanisms must be taken into account.

For this purpose, consider an artificial thermoelectric material p or n constituted of a macroscopic agglomerate of quantum dots (semiconductors or metals), or a quantum dot array (semiconductors or metals) immersed in a matrix of another material, or a series of quantum dots (semiconductors or metals) arranged to form nanowires.

If the source of heat applied to a thermoelectric material of this type is a source of electromagnetic radiation, the photons that reach the surface of the thermoelectric material may be absorbed by the quantum dots present in the superficial zone thanks to the presence of a band gap in the band energy structure of said dots. The width of the band gap depends on the material comprising each quantum dot and on the dimensions of the dots. Thus also metallic quantum dots present this band gap. When they are absorbed these photons dislodge the electrons from their energy level causing them to occupy excited levels. In this condition the electrons may easily be dislodged (the thermal energy is sufficient) and conduct electric current which is added to that generated by the pure Seebeck effect, the thermionic effect and the tunnel effect.

FIG. 3a shows, in diagram form through a lateral section, a first embodiment of an apparatus to convert electromagnetic radiation to electric energy 20 according to the invention.

Similarly to the apparatus shown in FIG. 1, this conversion apparatus 20 provides for couples 10, formed of an element of n type material 11 and an element of p type material 12, in the form of pillars. By the term "pillar" is meant a geometric shape of envelope for example of the parallelopiped or truncated-pyramid or truncated-cone shape that englobes a material of p type and a material of n type, specially nanostructured to minimise thermal conduction and at the same time maximise electric conduction. As was the case in FIGS. 1 and 2, the element of n type material 11, for short element n 11, is indicated by a dotted grid, whereas the element of semiconductor material of p type 12, for short element p 12, is illustrated by a lozenged grid, so as to distinguish them more clearly.

These elements n 11 and p 12 are thus substantially parallelopipeds, that, in the example illustrated in FIG. 3a and more clearly visible in the plan view of FIG. 3b, have cold end faces 18 and hot end faces 19 with rhomboidal section. The elements n 11 and p 12 of the cold side are connected through a cold metal junction 13 that covers the end faces 18. On the contrary, on the hot side, that is on the side from which radiation R comes, the elements 11 and 12 are connected through a conducting junction 24, that ensures the exchange of charge carriers, which nevertheless is only partially superimposed over said exposed faces 19, only resting on the perimeter of the hot end faces 19 and leaving these hot end faces 19 substantially exposed to the incident radiation R.

On the metallic conductor 24, which is substantially configured as a bridge between the element n 11 and the element p 12, a pyramid-shaped micro-mirror 25 is situated. Interposed between the hot metal junction 24 and the pyramid-shaped micro-mirror 25 is a dielectric layer 26. Thus, since the structure is replicated for each of the hot junctions 24, as may be seen in FIG. 3b, which is a plan view of the hot end faces 19, the converter apparatus 20 substantially comprises a matrix of elements n 11 and elements p 12 among which pyramid-shaped micro-mirrors 25 are positioned. These pyramid-shaped micro-mirrors 25 are capable of reflecting and guiding those portions of radiation R, that are directed towards the metal hot junction 24, towards the uncovered hot end faces 19 so as to maximise the coupling with the incident radiation R. So as to further increase such coupling the pyramid-shaped micro-mirrors 25 are also situated in the spaces between the elements n 11 and p 12, between each element p 12 and the subsequent element n 11 in FIG. 3a, where, in the configuration in series, on the hot side, metal hot junctions 24 are not provided for. In short, the pyramid-shaped micro-mirrors 25 are interposed between each element n 11 and p 12.

In the plan view in FIG. 3b, it may be seen that the hot faces 19 are of rhomboidal shape aligned along the axis of the rhombi, giving rise to a diamond configuration, with spaces between the hot faces 19 corresponding to the square shape of the base of the pyramid-shaped micro-mirrors 25, which can thus be lodged among the elements n 11 and p 12 in a highly compact and efficient structure. For simplicity of illustration, FIG. 3b does not show the metallic junctions 24. In FIG. 3b, the path of the current Ig is also shown, through a line of dashes, that follows a meandering course along the smaller side of the matrix.

FIG. 3c shows an alternative configuration of an apparatus 30 in which the hot faces 39 of the elements n 11 and p 12 have a substantially square section and are aligned along their sides in a chekerboard configuration. The pyramid-shaped micromirrors 25 are inserted with their square base, appropriately rotated, into the consequently square spaces between these hot faces 39. Such a configuration thus determines a first meandering path for the current Ig, shown through a line of dashes. It is therefore possible to insert, in a substantially interdigitate manner in such first path for the current Ig, a second meandering path for a second current Ig, shown through a dot-and-dash line, this likewise achieved through a second alternating series of elements n 11 and p 12, which in this case are indicated by a grid of diagonal dashes and by a grid of vertical dashes to distinguish them from the first alternation in series.

It is clear that the configuration of the apparatus 30 may be further varied in a spiral configuration or a co-penetrating double spiral configuration.

It is equally clear, with reference to the configurations in FIGS. 3a and 3b, that the so-called rhomboidal and square shapes of the exposed faces 19 and 39 indicate first and foremost the capability of the elements n 11 and p 12 to be aligned along their axes, in a diamond configuration, or along their sides, in a chekerboard configuration, it being clear that a square and rhombus with equal long axes determine the same shape, apart from the orientation. It is lastly clear that, in this context, different variants of dimension and shape are possible, among rhombi, parallelograms, squares and rectangles. Preferably, the ratio between height and side of the base of the individual pyramid-shaped micro-mirrors 25 must be greater than or equal to 2.5, in order to maximise the angle of reception of the incident radiation R. In order to avoid the pyramid-shaped micro-mirrors 25 casting shadows one on the other it is incidentally possible to alternate pyramids of different heights according, for example, to the technique illustrated in European patent application EP-A-766102 in the name of the same applicant, with regard to anti-reflecting surfaces with predetermined roughness.

FIGS. 4a, 4b and 4c show three different embodiments of an all-wavelength absorbent structure 50 that may be obtained on the hot face 19 of the element n 11, which is shown in these figures, and/or of the element p 12. This absorbent structure 50 performs an antireflection function, operating so that all the incident radiation R is absorbed on the hot face 19, and so that vice versa there is no reflection from that hot face 19. The co-operation of the absorbent structure 50 and the micro-mirrors 25 thus causes that the thermoelectric apparatus substantially absorbs 100% of the radiation R incident on its surface.

In FIG. 4a, this all-wavelength absorbent structure 50 is made in the form of a broadband antireflection grid 50a.

In FIG. 4b, this all-wavelength absorbent structure 50 is made in the form of a single pyramid-shaped hollow 50b.

In FIG. 4c, this all-wavelength absorbent structure 50 is made in the form of multiple pyramid-shaped hollows 50c.

It is also possible to obtain the absorbent structure 50 through an absorbent black layer.

FIGS. 5a, 5b and 5c show, associated respectively with the absorbent structure 50 in the form of a broadband antireflection grid 50, with the absorbent structure 50 in the form of a single pyramid-shaped hollow 50b and with the absorbent structure 50 in the form of multiple pyramid-shaped hollows 50c, an element 51 in the form of a truncated pyramid pillar, in which the hot face 19 thus has a lower surface with regard to the cold face 18. This causes the upper part of the element n 11 or 12 to be maintained at a higher temperature, so that, in this fashion, dissipation from the hot side to the cold side prejudices to a lesser extent the tendency of the system to equalise the temperatures of the hot and cold sides. The variable section does not decrease the electromotive force that pushes the electrons to move towards the hot side and the holes in the opposite direction.

FIG. 6a shows, in lateral section, a particular application of the converter apparatus 20, which is applied around a wall 60 of a pipe in which hot gases GC flow, for example around the wall of a car exhaust pipe. Externally to the converter apparatus 20, that is on the cold side, a cooling fluid may flow, for example water or air. FIG. 6b shows the thermoelectric apparatus 20 and the wall of the pipe 60 in frontal section, from which it is clear that a number of rectangular strips of the matrix of elements 11 and 12 with micro-mirrors 25 are applied onto the circumference of the wall 60. Alternatively, it may be possible to apply the matrix of elements 11 and 12 onto a flexible substratum that is folded and wrapped around the pipe.

Figure 7B:
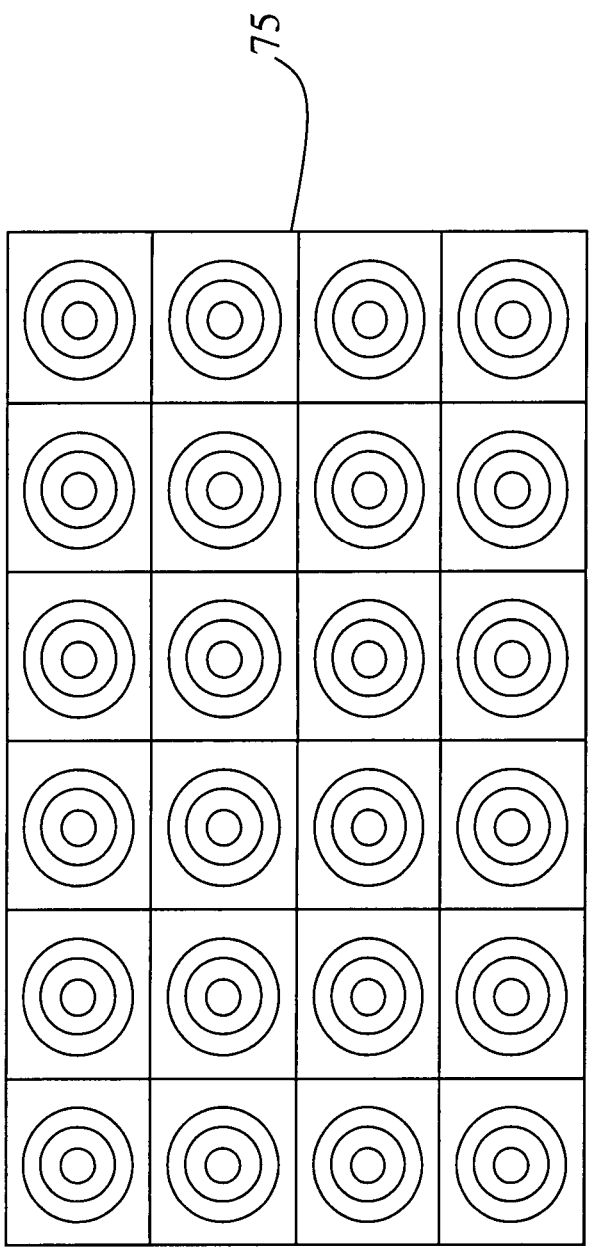
FIGS. 7a and 7b represent a further variant of the apparatus to convert electromagnetic radiation to electric energy according to the invention.
Figure 7A:
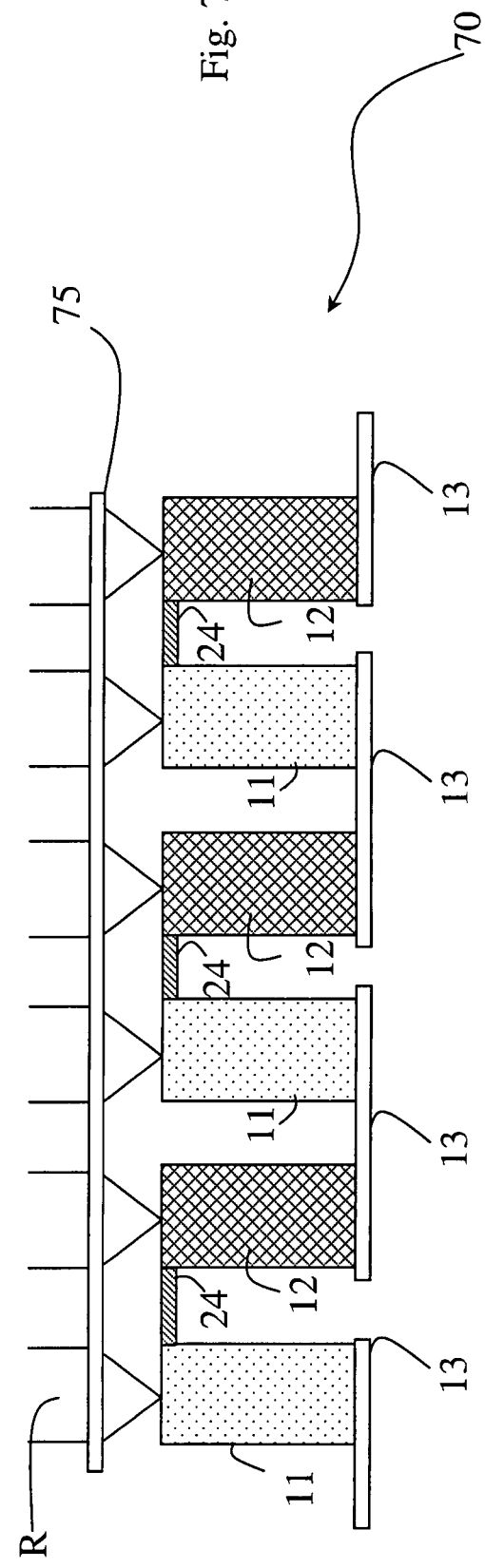

FIG. 7a shows a further embodiment of a generator apparatus 70, that comprises a structure of elements 11 and 12 alternated in series and connected by hot junctions 24 that leave their hot faces 19 uncovered, similarly to the apparatus 20 in FIG. 3a. However, in place of the pyramid-shaped micro-mirrors 25, as device to guide the radiation R a matrix of micro-lenses 75 is present, visible in plan in FIG. 7b.

This matrix of micro-lenses 75 focuses the radiation R through each micro-lens onto a hot face 19 of an element n 11 or 12. The matrix of micro-lenses 75 may equivalently be replaced by diffractive optics of the fan-out element type or by a generalisation of Damman gratings.

According to a preferred embodiment the elements n 11 and p 12 are provided for through nanocluster composites deposited through the Pulsed Microplasma Cluster Source, PMCS, technique, whereby the low kinetic energy of deposition does not make the clusters coalesce together and thus allows the electrons and the holes in the clusters to maintain the necessary energy discretisation to facilitate the thermionic effect and the tunnel effect as well as the coulomb blockade effect among clusters due to the electromotive force generated between the side exposed to radiation and the cold side.

The parallelopiped or truncated-pyramid pillars may for preference be made of nanostructured materials known in the literature in which the electrons flow (good conductance) but the phonons are scattered (poor thermal conductance), which may be determined among categories of the quantum dot type, nanowires, heterostructures, nanocomposites or nanoclusters. Among these, in particular nanocomposites may be used made of germanium and silicon, alternated structures of supergratings or nanowires.

FIGS. 8a and 8b show a generator apparatus 170 in a planar configuration, in which the electromagnetic radiation R is focused onto a region 172 on one side of the thermoelectric material, for example of the n type, which extends in the plane instead of vertically as the thermoelectric couples in FIGS. 3a and 3b.

Figure 9A:
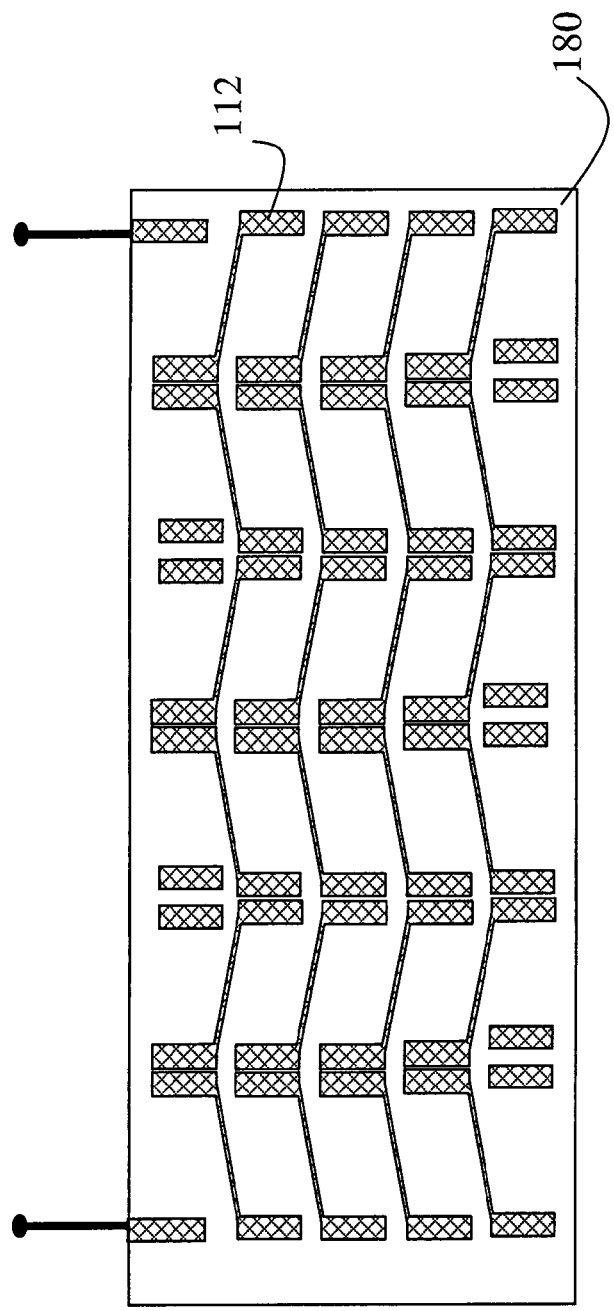
FIGS. 9a and 9b represent a detail of the generation apparatus in FIGS. 8a and 8b.

As may be seen in the lateral view in FIG. 8a, the micro-lenses 175, which may alternatively also be micro-mirrors, preferably cylindrical of the refractive or diffractive type or again of the Fresnel type, focus the radiation onto thermoelectric elements in the form of planar strips, that is of plates 111 of material of n type, deposited on an insulating substratum 180, as may better be seen in the plan view in FIG. 8b. As is shown in FIG. 9a, silkscreen printed contacts 112 of p type are situated on the insulating substratum 180. On these silkscreen printed contacts 112 of p type, platelets of thermoelectric material of n type are partially deposited. The hot side is indicated with 119, whereas the cold side is indicated with 118.

The radiation R may for preference be focussed onto a porous metallic strip 110 capable of better distributing heat throughout the depth of the hot side of the thermoelectric-thermionic material. The thermoelectric couples resulting between the tracks of material p and the plates of material n may be connected together according to various possible arrangements whereby the hot side of one element is connected to the cold side of another element. Connection among the hot and cold sides is preferably achieved by means of a conducting track of material of p type with positive Seebeck coefficient and low thermal conductance and in general that can be silkscreen printed or evaporated or deposited by sputtering, by electrodeposition, by beam cluster or preferably by spray pyrolysis.

The conducting track of p type must preferably have a very high ratio between length and thickness and between length and width in order to favour the dissipation of heat, without which the hot and cold sides would tend to come into a condition of thermal stability. A limited thickness of the connecting track p does not decrease the electronic conductance of the track itself. Electric tracks of p type may in their turn be deposited by superimposed thin layers to further favour heat dissipation.

Onto the electric contacts of p type the thermoelectric material of n type is then deposited, for example material of the skutterite type, in a single layer or in a number of thin layers, with inclusions of nanoparticles to favour thermal scattering in its propagation from the hot side to the cold side.

Figure 9B:
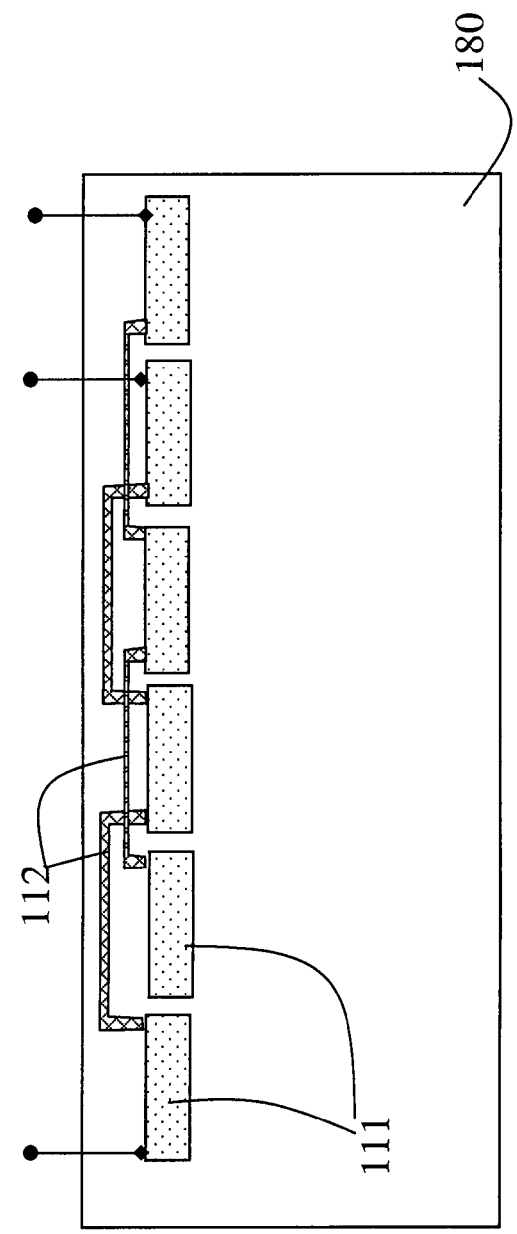

Connection among the blocks of n type may come about through various types of connection through tracks of p type for example according to the configuration shown in FIG. 9b.

Figure 10:
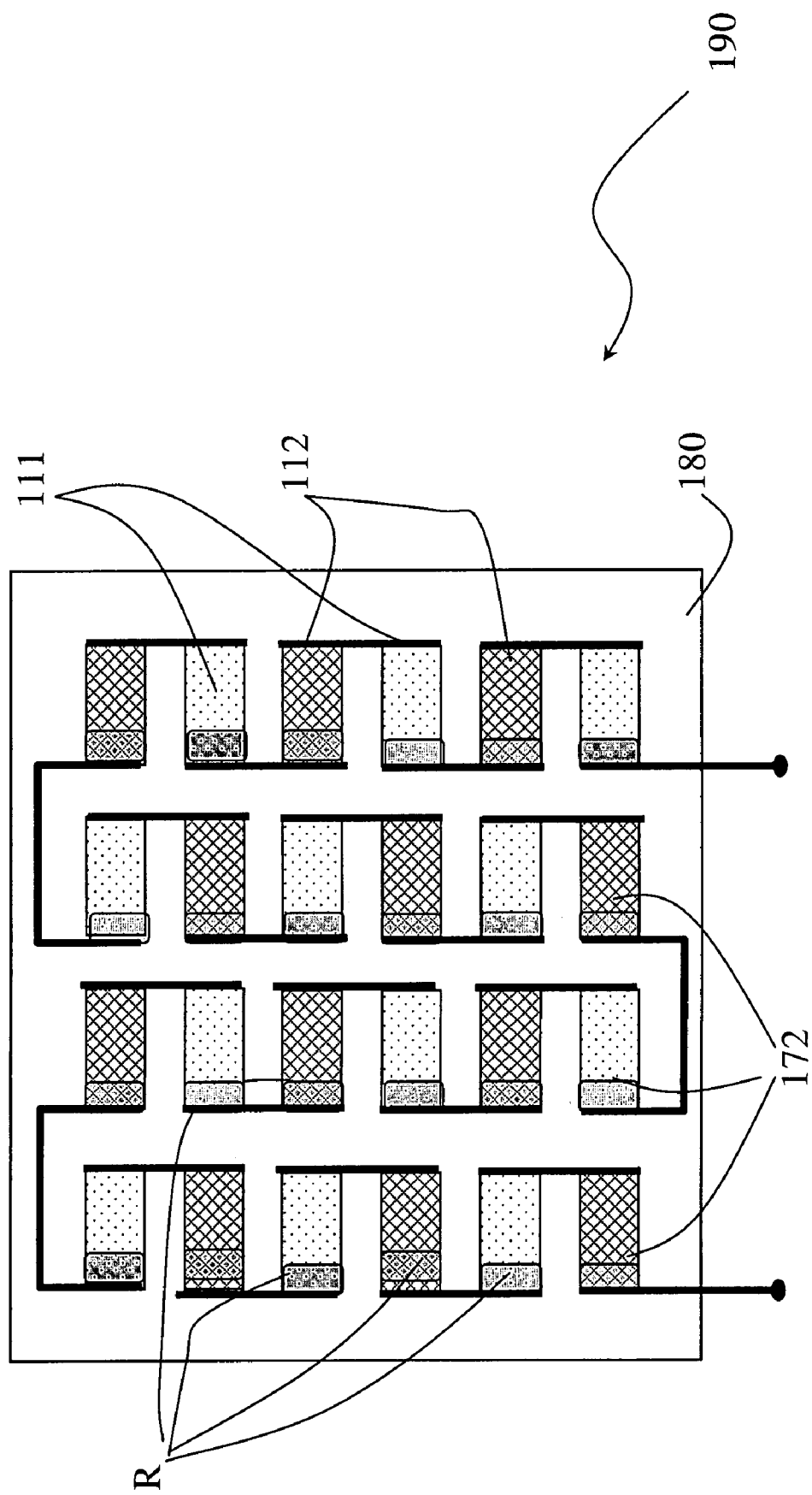
FIG. 10 represents a further variant of the generation apparatus in FIGS. 8a and 8b.

In a more conventional configuration of a converter apparatus 190 a conducting track 120 for connection may be of conducting metal and the focusing of the matrix of micro-lenses 175 may come about according to what is illustrated in FIG. 10, which shows a configuration in which the conducting tracks 120 are made of conducting material, such as copper or silver or in general a good conductor that can be silkscreen printed or evaporated.

The elements n 111 and p 112 are arranged adjacently on the substratum 180 and connected by means of such conducting tracks 120. In this case, therefore, the conducting metal connects sides at the same temperature of the thermoelectric elements of n type 111 and of p type 112 deposited separately after the conducting track 120. In a possible configuration the semiconductor material may be of the same type and is doped in subsequent phases on site so that it becomes of p type or of n type.

The solution just describes makes it possible to achieve marked advantages with regard to known solutions.

To advantage, the apparatus described indeed makes it possible to remove the ceramic elements and the metal elements that reflect the incident radiation and instead to obtain direct incidence on the thermoelectric elements, such thermoelectric elements being to advantage of the nanostructured type, with heterostructures, nanoclusters or quantum dots that therefore further amplify the advantage of the direct incidence, causing the onset or favouring further physical phenomena as well as thermoelectricity, such as thermionic emission and conductance through the tunnel effect.

Furthermore, the pyramids or micro-lenses lend themselves to be made through nanostructuring, particularly compatible with the production technology of the nanostructured series of n and p semiconductors for the conversion of electromagnetic radiation through the Seebeck effect and generation of carriers by the thermionic and tunnel effects.

The use of a device based on the thermoelectric effect, the thermionic effect as well as on the tunnel effect to convert solar energy into electric energy presents marked advantages in terms of absorbed power with regard to the photovoltaic solutions currently used.

Indeed, a photovoltaic cell in silicone (crystalline, polycrystalline or amorphous) has an absorption spectrum approximately between 350 nm and 1100 nm, whereas the solar energy that reaches the surface of the earth is mainly concentrated in the interval between 400 nm and 2500 nm. The combined use of a number of junctions in multi-junction cells enables absorption of a greater proportion of the solar spectrum to be obtained, increasing the overall efficiency of the cell, but the complicated technology required to make this type of cell means that they are very expensive.

On the contrary, in the case of a device operating through thermoelectric, thermionic and tunnel effects, energy is absorbed in the form both of heat and directly as radiation-electron interaction of the nanostructured material, the entire solar spectrum is absorbed and contributes to the generation of electric energy. The materials and the technology to make such devices are not excessively expensive and the devices themselves require virtually no maintenance and have a long life.

Of course, without prejudice to the principle of the invention, details of construction and embodiments may be varied widely with respect to what is described and illustrated herein purely by way of example, without thereby departing from the scope of the present invention.

The pyramid-shaped micro-mirrors may also be replaced by CPC parabolas (Compound Parabolic Collector).

There are many possible applications of electric generators that convert electromagnetic radiation from the sun, from a source of heat or from a nuclear source. Among these, generators of electric energy for street signs, generators for application on the surface of means of transport, collecting the sun's radiation on the hot junction and exploiting the flow of air in an air space between the cold junction and the vehicle roof, and generators for space applications may be listed.

The invention claimed is:

1. Apparatus to convert electromagnetic radiation into electric current, of the type that comprises a plurality of junctions between a first element made of p-type material and a second element made of n-type material, said plurality of junctions defining a plurality of couples, each couple comprising a hot junction and a cold junction, said plurality of couples receiving a thermal flow generated by the electromagnetic radiation incident in the direction of a region including the hot junction, said apparatus-including a device for guiding said electromagnetic radiation towards said plurality of couples characterised in that said first element and/or said second element include nanostructured materials and in that said device for guiding said radiation comprises a plurality of guiding elements that guide said electromagnetic radiation onto uncovered faces of the respective first element and second element of the couples exposed to said electromagnetic radiation.

2. Apparatus according to claim 1, characterised in that said nanostructured materials included in said first element of material with conduction through carriers of positive charge and/or said second element of material with conduction through carriers of negative charge are configured to induce, upon receiving said electromagnetic radiation directly, thermoelectricity, thermoelectronic emission and emission of tunnel electrons.

3. Apparatus according to claim 1, characterised in that said plurality of couples is arranged in series with respect to a generated current and in parallel with respect to a thermal flow generated by a radiation incident on said plurality of couples.

4. Apparatus according to claim 3, characterised in that said exposed faces are connected electrically through metallic junctions that are only partially superimposed over said exposed faces.

5. Apparatus according to claim 3, characterised in that said exposed faces of respective elements of couples comprise anti-reflection elements for absorbing the radiation.

6. Apparatus according to claim 3, characterised in that said first material and/or second material are semiconductors presenting a composite or cluster nanostructure.

7. Apparatus according to claim 3, characterised in that said plurality of guiding elements comprise micro-mirrors.

8. Apparatus according to claim 7, characterised in that said micro-mirrors are pyramid shaped.

9. Apparatus according to claim 7, characterised in that said micro-mirrors are situated on one or more of said metallic junctions.

10. Apparatus according to claim 9, characterised in that dielectric layers are interposed between said micro-mirrors and said metallic junctions.

11. Apparatus according to claim 10, characterised in that the ratio between the height and the side of the base of the pyramid-shaped micro-mirrors is greater than or equal to 2.5.

12. Apparatus according to claim 11, characterised in that said pyramid-shaped micro-mirrors have alternately different heights.

13. Apparatus according to claim 3, characterised in that said plurality of guiding elements comprise CPC parabolas.

14. Apparatus according to claim 3, characterised in that said plurality of guiding elements comprises a matrix of micro-lenses.

15. Apparatus according to claim 3, characterised in that said plurality of guiding elements comprise optical diffraction elements of the fan-out element type.

16. Apparatus according to claim 3, characterised in that said plurality of guiding elements comprise Damman grating elements.

17. Apparatus according to claim 3, characterised in that said plurality of guiding elements comprise elements of refractive micro-optics.

18. Apparatus according to claim 3, characterised in that said plurality of electric couples is arranged in the form of a matrix.

19. Apparatus according to claim 18, characterised in that said matrix of couples comprises elements with rhomboidal section aligned along one of their axes so as to determine a diamond matrix.

20. Apparatus according to claim 18, characterised in that said matrix of couples comprises elements of square section aligned along their sides so as to determine meandering paths.

21. Apparatus according to claim 20, characterised in that it includes a number of meandering paths arranged in an interdigitate manner.

22. Apparatus according to claim 3, characterised in that said first element of semiconductor material of a first type of conductance and/or second element of semiconductor material of a second type of conductance connected through junctions are of truncated-pyramid pillar shape.

23. Apparatus according to claim 5, characterised in that said that absorbent structure comprises a broadband antireflection grating.

24. Apparatus according to claim 5, characterised in that said absorbing structure comprises a pyramid-shaped cavity.

25. Apparatus according to claim 5, characterised in that said absorbing structure comprises a multiple pyramid-shaped cavity.

26. Apparatus according to claim 5, characterised in that said absorbing structure comprises a black absorbent layer.

27. Apparatus according to claim 1, characterised in that said plurality of couples is arranged in series with respect to a generated current and in a planar configuration on an insulating substrate.

28. Apparatus according to claim 27, characterised in that said first element and said second element of said couples are arranged in layers superimposed over said substrate and arranged in series with respect to said thermal flow and in that said guiding elements guide said radiation onto faces exposed to said radiation of the respective first element or of the second element of the couples, in a region associated to the hot junction of said first element or second element.

29. Apparatus according to claim 27, characterised in that one among said first element or second element is silk-screen printed or evaporated in tracks on said substratum.

30. Apparatus according to claim 27, characterised in that said first element and said second element are arranged on said substrate in adjacent layers and in parallel with respect to said thermal flow and in that said guiding elements guide said radiation onto faces exposed to said radiation of the respective first element or of the second element of the couples, in a region associated to the hot junction of said first element or second element.

31. Apparatus according to claim 27, characterised in that said guiding elements comprise cylindrical micro-mirrors or micro-lenses.

32. Apparatus according to claim 1, characterised in that said first element of material with conduction to carriers of positive charge and/or second element of material with conduction to carriers of negative charge comprise nanoclusters or nanowire or heterostructures or quantum dots or nanocomposites with good electric conductance and poor heat conductance.

33. Apparatus according to claim 32, characterised in that said clusters are deposited with PMCS (Pulsed Microplasma Cluster Source) techniques, maintaining a low kinetic energy to avoid the clusters coalescing together and thus allowing the carriers to maintain energy discretisation in the clusters necessary to facilitate the thermionic effect, the tunnel effect and the Coulomb blockade among the clusters due to the electromotive force generated between the side exposed to radiation and the cold side.

34. Apparatus according to claim 33, characterised in that said nanocomposites are germanium-silicon nanocomposites.

35. Apparatus according to claim 1, characterised in that said nanostructured material comprises massive material selected from among a group comprising skutterudites, clatrates, complex calcogenides, oxides, Heusler alloys, quasicrystals, pentatellurides (Zr1-xHfxTe5, etc.), rare earths (Ce3Pt3Sb4, etc.), silicides of the transition metals, boron carbides, Zn4Sb3, tellurides containing tallium, Bi—Sb alloys.

36. Apparatus according to claim 1, characterised in that said nanostructured material comprises a massive material of the skutterite type in a single layer or with a number of layers with inclusions of nanoparticles to aid thermal scattering.

37. Apparatus according to claim 1, characterised in that it is associated to a pipe in which hot gases flow.

38. Procedure for the conversion of electromagnetic radiation to electric current that includes the operations of
providing for a plurality of junctions between a first element made of p-type material and a second element made of n-type material to define a plurality of couples, each couple comprising a hot junction and a cold junction to receive a thermal flow generated by the electromagnetic radiation incident in the direction of a region including the hot junction, and
guiding said electromagnetic radiation toward said plurality of couples, characterised in that
nanostructured materials are provided for in said first element and/or said second element and in that said radiation is guided directly onto the uncovered faces of the respective first element and second element of the couples that are exposed to said electromagnetic radiation.

* * * * *